Figure 1A:
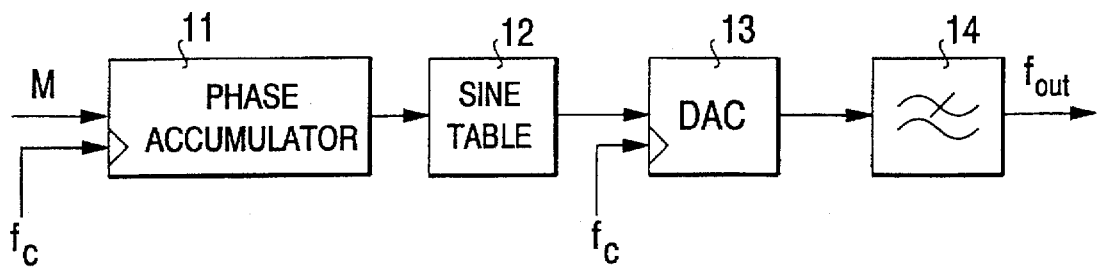

United States Patent [19]

Lindholm

[11] Patent Number: 5,726,609
[45] Date of Patent: Mar. 10, 1998

[54] PULSE AMPLITUDE MODULATOR USING DIRECT DIGITAL SYNTHESIZER

[75] Inventor: Jari Lindholm, Helsinki, Finland

[73] Assignee: Nokia Telecommunications Oy, Espoo, Finland

[21] Appl. No.: 737,823

[22] PCT Filed: May 18, 1995

[86] PCT No.: PCT/FI95/00268

§ 371 Date: Nov. 20, 1996

§ 102(e) Date: Nov. 20, 1996

[87] PCT Pub. No.: WO95/32550

PCT Pub. Date: Nov. 30, 1995

[30] Foreign Application Priority Data

May 20, 1994 [FI] Finland ............... 942374

[51] Int. Cl.$^6$ ............... H03K 7/02; H04L 27/04
[52] U.S. Cl. ............... 332/115; 375/268; 375/300; 455/108
[58] Field of Search ............... 332/115, 116; 375/268, 300; 455/108

[56] References Cited

U.S. PATENT DOCUMENTS

| | | |
|---|---|---|
| 4,992,743 | 2/1991 | Sheffer ............... 332/149 |
| 5,583,467 | 12/1996 | Loewenguth et al. ............... 332/115 |

FOREIGN PATENT DOCUMENTS

| | | |
|---|---|---|
| 0078857 | 5/1983 | European Pat. Off. |
| 4404004 | 11/1994 | Germany. |

*Primary Examiner*—Siegried H. Grimm
*Attorney, Agent, or Firm*—Cushman Darby & Cushman IP Group of Pillsbury Madison & Sutro LLP

[57] ABSTRACT

A method and an apparatus for forming a pulse amplitude modulated signal in association with digital modulation. In the method symbols to be transmitted are formed from bits of an incoming bit stream. In order to achieve an accurate timing even when a bit clock contains abundant jitter, sample values of a pre-low-pass-filtered waveform of a pulse to be transmitted, covering at least one symbol period, are stored in a memory, sample values are read from the memory at the rate of a constant-frequency clock signal ($f_c$, $4 \times f_c$), and a sample value read from the memory is multiplied by a predetermined factor the value of which is formed as a response to the symbol being transmitted.

10 Claims, 3 Drawing Sheets

PULSE AMPLITUDE MODULATOR USING DIRECT DIGITAL SYNTHESIZER

This application is the national phase of international application PCT/FI95/00268, filed May 18, 1995 which designated the U.S.

The invention relates to a method and to an apparatus for forming a pulse amplitude modulated (PAM) signal.

A recurrent problem particularly in so-called HDSL modems (High Speed Digital Subscriber Line) is that a timing signal received from outside the transmitter contains abundant jitter. Optimal elimination of jitter is called for as at high symbol rates even minor jitter will impair performance. Requirements for timing accuracy are especially high when the so-called echo cancellation technique is used. This is because high accuracy is required of signal values at echo cancellation points, as even the slightest ambiguity an timing may cause too big an error in the signal value.

A qualitatively superior clock signal may be generated by means of a phase lock which adequately damps out jitter (i.e. which is sufficiently narrow-band). A phase lock may be realized as a digital or an analog phase look with a voltage controlled crystal oscillator. A disadvantage of a digital phase lock is, however, that it generates phase hope that are equal in length to one cycle of the master clock being used. Even less than 10 ns phase hops are called for in HDSL modems, whereby an over 100 MHz master clock frequency would be required. With present technology, this is, however, a slightly too high a frequency. Similarly, phase hops of 5 ns would require a 200 MHz clock, etc. The disadvantage of a voltage controlled crystal oscillator is that it cannot be completely integrated into a digital circuit. In addition to the VCO, a loop filter has to be realized by analog technique.

Instead of using an external clock signal, the clock signal may be generated inside the modem. With a multi-bit-rate modem, fractions must often be used as divisors (in addition to integers) in order to obtain all pertinent clock frequencies by division from the frequency of the internal clock oscillator of the modem. This will cause jitter for the clock signal to be generated, i.e. the case is principally similar to that of an external clock signal.

The main object of the present invention is to provide a method and an apparatus guaranteeing an accurate timing in the above cases.

The idea of the invention is to store in a memory a pre-filtered waveform of a PAM pulse to be transmitted and multiply the sample values, read from the memory at the rate of a fixed-frequency clock signal, by a factor to be modified according to the symbol being transmitted.

The solution of the invention provides integration of an implementation with accurate timing into a completely digital circuit. The desired accuracy is obtained by choosing an adequate bit accuracy.

The bandwidth of many transmission paths is also in some way limited, and a pulse to be transmitted must be filtered. With the method of the invention digital filtration may easily be integrated into the same apparatus, whereby only a simple analog filter is needed for eliminating harmonic spectrum components.

Figure 1B:
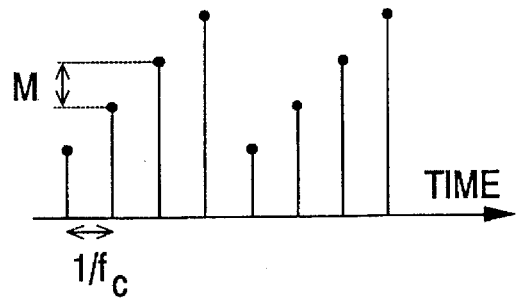
Figure 1C:
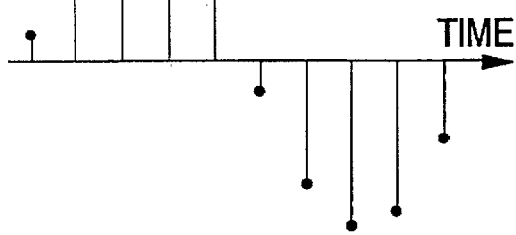
Figure 4:
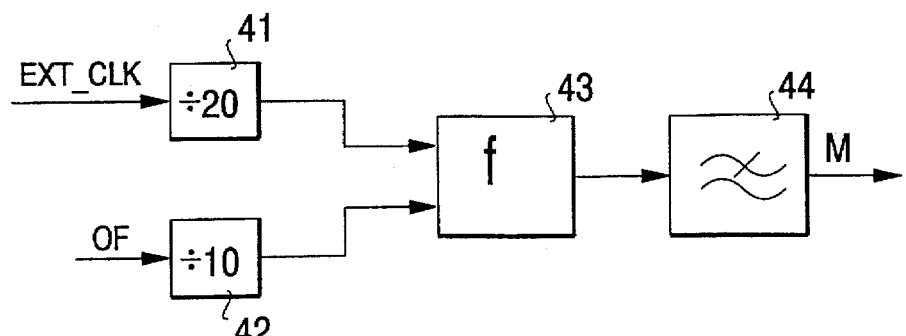
Figure 2:
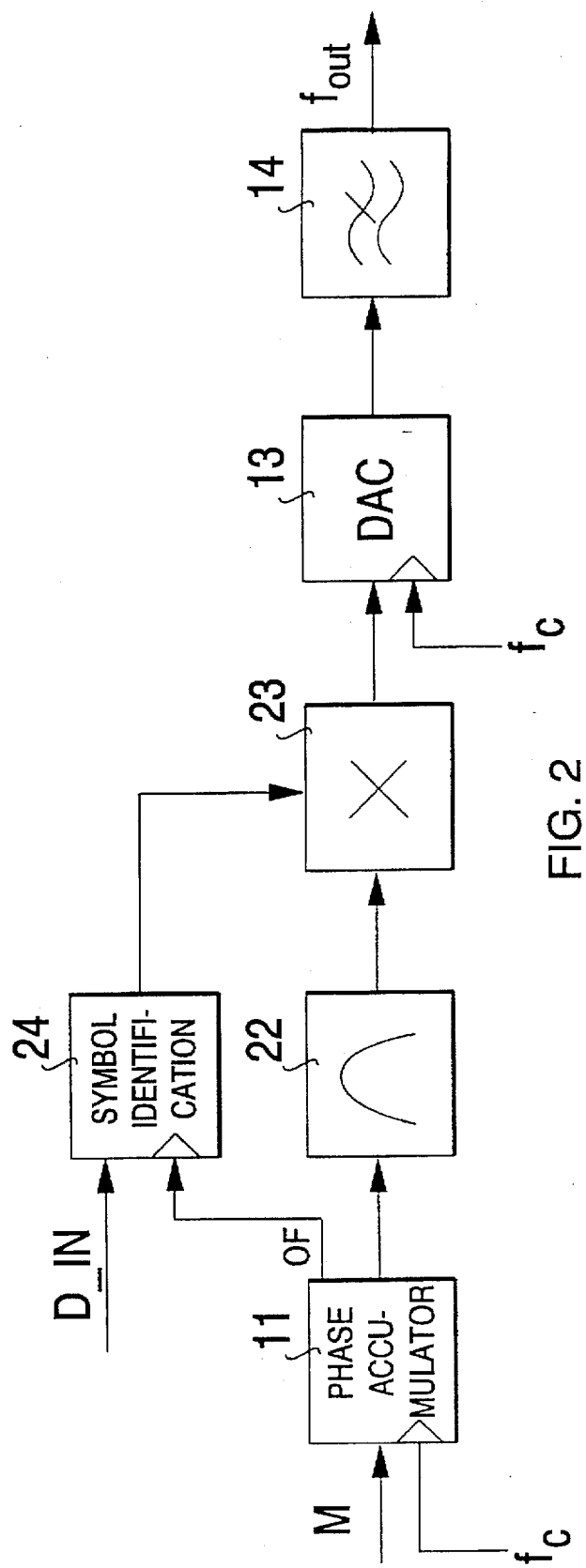
Figure 3:
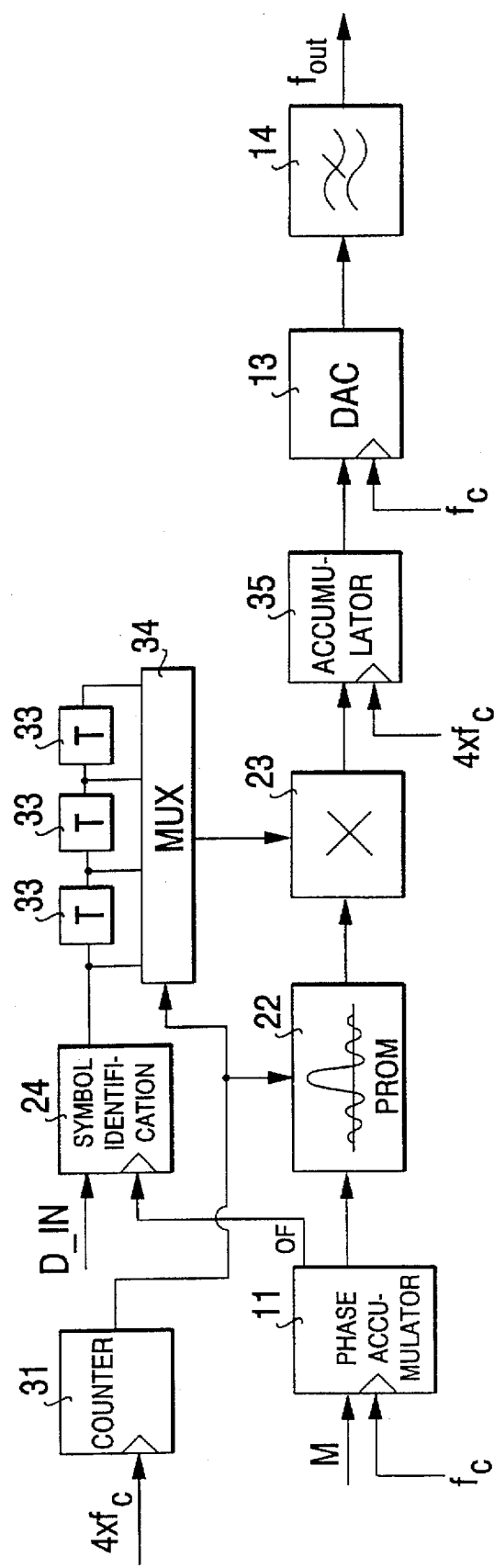

In the following the invention and its preferred embodiments will be described in greater detail with reference to examples in accordance with the accompanying drawings, in which FIG. 1a illustrates the principle of a direct digital synthesis, FIG. 1b shows a signal at an output of a phase accumulator of the apparatus of FIG. 1, FIG. 1c shows a signal at an output of a sine table of the apparatus of FIG. 1, FIG. 2 shows the principle of digital pulse amplitude modulation of the invention, FIG. 3 shows a preferred embodiment of the apparatus of the invention, FIG. 4 shows formation of a phase increment signal used in the apparatus of FIGS. 2 and 3.

To illustrate the invention, FIG. 1a first shows the principle of direct digital synthesis (DDS). In the DDS system a phase increment signal M and a clock signal $f_c$ are first fed into a phase accumulator 11. The phase accumulator comprises an adder and a latch, connected in succession, and the phase accumulator adds the value M to its former value at each clock pulse. The value of the phase accumulator is thus incremented at the clock signal $f_c$ rate, whereby an increasing ramp according to FIG. 1b is formed at the output of the phase accumulator. The value at the output of the phase accumulator increases thus by the amount M at $1/f_c$ intervals. With an overflow in the accumulator, it is allowed to rotate (the accumulator is thus not reset, but instead with the accumulator rotating, the calculation cycle is changed and a value corresponding to the first clock pulse in a new cycle will again become the new value). The output of the phase accumulator is connected as a read address to a sine table 12, wherein one sinusoidal signal cycle has been stored. The value of the sine table output is thus $$\sin\left(\frac{\text{value of phase accumulator}}{2^N} \cdot 2\pi\right)$$

where N is the width in bits of the phase accumulator. A digital sinusoidal signal, shown in FIG. 1c, received from the sine table, is conveyed to a digital-to-analog converter 13, where it is converted into analog form. (It should be observed that the time axes of FIGS. 1b and 1c are not comparable; one ramp shown in FIG. 1b corresponds to one sine cycle.) Harmonic spectrum components are eliminated from the analog signal by a low-pass filter 14 following the D/A converter, whereby a pure sine wave is received at the filter output. The frequency $f_{out}$ of the sinusoidal signal is $$f_{out} = M \times (f_c / 2^N) \tag{1},$$

where N is the width in bits of the phase accumulator and M represents the phase increment performed in each clock cycle. By increasing the width of the phase accumulator, it is possible to produce a very high frequency resolution. If the sine table and the D/A converter are also kept adequately accurate, the output frequency will have the desired accuracy.

FIG. 2 shows how digital pulse amplitude modulation is added to the above DDS system in accordance with the method of the invention. Instead of samples corresponding to one cycle of a sinusoidal signal, samples of a pre-low-pass-filtered PAM pulse of the length of one symbol period are stored in a memory 22, and a simple multiplication circuit 23 is connected to the memory output. An incoming bit string D_IN is connected to a data input of a symbol identification circuit 24, and an output signal OF reflecting an over-flow in the phase accumulator is connected to a clock input of the circuit 24. The output of the circuit 24 is connected to the multiplication circuit 23. The output signal value of the phase accumulator 11 increases, as presented above, at the rate of the clock signal $f_c$. The read address of the memory 22 is received from the said value. The memory 22 is thus read at the rate of the clock signal $f_c$ from addresses given by the phase accumulator. Waveform samples received from the memory are multiplied in the multiplication circuit 23 by a factor determined by the symbol identification circuit 24 on the basis of the symbol which the bits at its input correspond to. E.g. when four different symbols, i.e. four different amplitude levels (used in the following as an example) are used, two bits at a time are always read into the circuit 24 (at the rate of the signal OF). Depending on which bit combination, 00, 01, 10 or 11, is concerned, the circuit 24 assigns one of the numerals +1, −1, +3, or −3 to a factor to be used by the multiplication circuit. When an overflow occurs in the phase accumulator (a new symbol period starts), the next 2 bits are read into the identification circuit 24, whereby the identification circuit will assign to the multiplication circuit a factor corresponding to the new symbol. The digital signal received from the multiplication circuit output is converted into an analog form in a D/A converter 13 and harmonic spectrum components are eliminated by a low-pass filter 14. In the method of the invention a sample value is thus calculated for the input filter 14 at instants when the D/A converter is clocked, and the phase or frequency of the D/A converter clock signal is not changed.

In accordance with the invention it is essential that sample values of a low-pass filtered pulse are stored in the memory 22, i.e. the waveform of a pre-filtered PAM pulse is in the memory. It is thus essential that filtering is already effected before D/A conversion. In this manner the pulse to be transmitted (e.g. its zero crossing) may be set more accurately. With no sharp changes in the waveform, its location on the time axis may be adjusted accurately e.g. by changing the values of samples taken from stored waveforms so that the location of the waveform with respect to the time axis is changed (the adjustment may be effected regardless of the clock signal $f_c$, cf Formula 1).

If values corresponding to an unfiltered waveform are stored in the memory 22, the location of the pulse to be transmitted is completely tied to the edges of the clock signal $f_c$ (e.g. the rising edges). In practice, a variation corresponding to two successive rising edges of the clock signal $f_c$ at the location of the pulse to be transmitted may, however, in practice result in too high an ambiguity.

FIG. 3 shows a preferred embodiment of the above basic solution. The same reference numerals have been used for the same items as in FIGS. 1a and 2 above. In order to obtain a better filtration result, the symbols to be transmitted have to be filtered more than the duration of one symbol period. In this example the waveform of a pulse to be transmitted, so that the stored values cover a period of four symbol periods, has been stored in the PROM memory 22. In practice the wave form may correspond to e.g. a sinc pulse. The values of the symbols are input from the identification circuit 24 into a delay line formed from successive delay elements 33 (in this example 3 elements). The delay of one delay unit corresponds to the length of one symbol period. Thus the values (±1, ±3) of the last four symbols are stored in the delay line. A new arriving symbol will always cause the value of the oldest symbol to be deleted from memory. From both ends of the delay line and from the middle of the delay elements, inputs (totalling 4) have been formed for a multiplexer 34 by means of which the value of one symbol is chosen for the multiplication circuit 23. When a sample is calculated for the D/A converter 13, all four symbols are taken into consideration. This function is described below.

Phase information is again received from the phase accumulator 11 at the rate of the clock signal $f_c$. In this case a counter 31 has been added to the apparatus, which counter will step continuously from one to four (states 00, 01, 10 and 11) at a quadruple frequency compared with the clock signal $f_c$, whereby the current phase of the counter (i.e. which of the four phases is concerned) determines which of the four symbol periods in the memory is concerned, and additionally, which symbol value is input via the multiplexer 34 to the multiplication circuit 23. When the reading of the counter 31 is 00, a sample corresponding to the first symbol period is taken from the memory 22, and the value of a corresponding symbol is taken via the multiplexer 34, and these values are multiplied in the multiplication circuit 23. With a counter reading 01, a sample corresponding to the next symbol period is taken from the memory 22, and the value of a corresponding symbol, delayed for the duration of one symbol period, is taken via the multiplexer, and these are multiplied in the multiplication circuit 23. Similarly, the values of the waveform corresponding to the counter phases 10 and 11 are multiplied by corresponding symbol values. The result of four such successive multiplications is summed up in an accumulator 35 succeeding the multiplication circuit and the result is conveyed to the D/A converter 13. One calculated sample is thus still obtained for each cycle of the clock signal $f_c$ for the D/A converter 13, but in this case the filtration is more efficient than in the example of FIG. 2. In this case the memory is read at a quadruple rate, and the counter 31 determines which symbol period is concerned and the phase accumulator determines the phase within the symbol period.

The clock signal $f_c$ is obtained from a fixed oscillator inside the apparatus (not shown). The size M of the phase increment is obtained from a digital phase-locked loop. E.g. if the frequency of the clock signal $f_c$ is tenfold compared with the bit clock and 2B1Q encoding, described in the above example, is used, the phase lock may be realized in a manner shown in FIG. 4. An external bit clock EXT_CLK (which may contain abundant jitter as mentioned above) is brought via a first frequency divider 41 to a first input of a phase comparator 43. In this case the divisor of the frequency divider is twenty. A signal OF (forming the feedback of the loop) indicating a phase accumulator overflow is brought via a second frequency divider 42 to a second input of the phase comparator. In this case the divisor of the second frequency divider is ten. (The ratio of the divisors of the frequency dividers corresponds to the ratio of the symbol frequency to the bit frequency.) A signal representing the phase increment M is obtained from the output of a digital loop filter 44.

If timing is formed inside the apparatus, a fixed value may be chosen for the phase increment M in accordance with the Formula (1).

The ratio of the clock signal $f_c$ formed inside the apparatus to the symbol rate (to an external clock signal) is not predetermined as the clock signals originate from different sources. Consequently the presentation of the outgoing symbol is occasionally calculated in 9 or 11 phases (instead of 10). This does not, however, affect the function of the low-pass filter. As described above, the clock rate of the D/A converter (the internal clock signal $f_c$ of the apparatus) does not necessarily have to be an integer multiple of the symbol rate.

Even though the invention has been explained in the above with reference to examples in accordance with the accompanying drawings, it is obvious that the invention is not restricted to them but can be modified within the scope of the inventive idea disclosed in the above and in the attached claims. E.g. the length of the waveform to be stored may vary according to the desired accuracy or the available storage capacity (causing e.g. a corresponding change in the clock frequency of the counter 31). Since by known techniques it is not necessarily worth integrating a very large ROM memory into a circuit, a separate ROM/RAM memory may also be used for storing the waveform.

I claim:

1. A method for forming a pulse amplitude modulated signal in association with digital modulation, in accordance with which method symbols to be transmitted are formed from bits of an incoming bit stream (D_IN), characterized in that sample values of a pre-low-pass-filtered waveform of a pulse to be transmitted, covering at least one symbol period, are stored in a memory (22), sample values are read from the memory (22) at the rate of a constant-frequency clock signal ($f_c$, $4 \times f_c$), and a sample value read from the memory (22) is multiplied by a predetermined factor, the value of which is formed as a response to the symbol being transmitted.

2. A method as claimed in claim 1, characterized in that a waveform of a pulse to be transmitted, covering one symbol period, has been stored in the memory (22), the value resulting from the multiplication constituting directly a sample value of a digital pulse amplitude modulated signal.

3. A method as claimed in claim 1, characterized in that a waveform of a pulse to be transmitted, covering several symbol periods, has been stored in the memory (22), and the results of several multiplications are summed up (35) as one sample value of a digital pulse amplitude modulated signal.

4. A method as claimed in claim 1, characterized in that successive sample values are input directly via a D/A converter (13) to an analog low-pass filter (14).

5. A method as claimed in claim 1, characterized in that a phase accumulator (11) is used for forming the read address of a sample value to be read from the memory (22), an output value of the accumulator determining a sample value corresponding to each phase of a symbol period.

6. An apparatus for forming a pulse amplitude modulated signal in association with digital modulation, the apparatus comprising means (22–24; 22–24, 33, 34) for forming symbols to be transmitted from bits of an incoming bit stream (D_IN), characterized in that said means comprise a memory (22) for storing sample values of a pre-low-pass-filtered waveform of a pulse to be transmitted from at least one symbol period, multiplication means (23) connected to an output of the memory (22) for multiplying a sample value read from the memory (22) by a predetermined factor, and symbol identification means (24) for forming a factor, used in multiplication, as a response to a symbol being transmitted.

7. An apparatus as claimed in claim 6, characterized in that sample values of a waveform of a pulse to be transmitted, covering several symbol periods, have been stored in the memory (22), said means comprising additionally storage means (33) for storing symbol values from several symbol periods (T), and means (34) for selecting one symbol value at a time for the multiplication means, and summing means (35) for summing up the results of several successive multiplications to form a sample value.

8. An apparatus as claimed in claim 7, characterized in that said storage means comprise a delay line comprising three successive delay elements (33).

9. An apparatus as claimed in claim 6, characterized in that it comprises a phase accumulator (11) whose output signal is connected to the memory (22) for reading of a sample value corresponding to the current phase of a symbol period from the memory (22).

10. A method as claimed in claim 2, characterized in that successive sample values are input directly via a D/A converter (13) to an analog low-pass filter (14).

* * * * *